United States Patent [19]

Forrest et al.

[11] Patent Number: 5,072,439
[45] Date of Patent: Dec. 10, 1991

[54] HIGH SPEED OPTO-ELECTRONIC CROSSBAR SWITCH

[75] Inventors: Stephen R. Forrest, Torrance; Gregory L. Tangonan, Oxnard, both of Calif.

[73] Assignee: Hughes Aircraft Company, Los Angeles, Calif.

[21] Appl. No.: 494,640

[22] Filed: Mar. 16, 1990

[51] Int. Cl.$^5$ .............................................. H04J 14/00

[52] U.S. Cl. ................................. 359/115; 359/109

[58] Field of Search ................ 370/1, 3; 455/600, 607, 455/612, 613, 609; 340/825.82; 250/578.1, 553, 552; 350/96.13, 96.14

[56] References Cited

U.S. PATENT DOCUMENTS

| | | | |
|---|---|---|---|
| 3,883,222 | 5/1975 | Gunderson | 350/96 C |
| 4,062,043 | 12/1977 | Zeidler | 455/612 |
| 4,074,142 | 2/1978 | Jackson | 250/551 |
| 4,165,225 | 8/1979 | Auracher et al. | 455/612 |
| 4,221,932 | 9/1980 | Anglikowski | 455/615 |
| 4,549,313 | 10/1985 | Rozenwaig | 455/600 |
| 4,630,254 | 12/1986 | Tseng | 455/607 |
| 4,656,350 | 4/1987 | Faugeras et al. | 455/600 |
| 4,696,059 | 9/1987 | McDonald | 455/600 |
| 4,707,062 | 11/1987 | Abe et al. | 350/96.16 |
| 4,723,309 | 2/1988 | Mochizuki | 455/612 |
| 4,748,614 | 5/1988 | Dammann | 370/1 |
| 4,783,850 | 11/1988 | MacDonald et al. | 455/600 |
| 4,811,210 | 3/1989 | McAulay | 370/1 |
| 4,901,305 | 2/1990 | Tangonan | 370/1 |
| 4,953,155 | 8/1990 | Tangonan et al. | 455/600 |

FOREIGN PATENT DOCUMENTS

| | | | |
|---|---|---|---|
| 0053028 | 6/1982 | European Pat. Off. | |
| 0161683 | 11/1985 | European Pat. Off. | 455/600 |
| 0216167 | 4/1987 | European Pat. Off. | |
| 2454633 | 11/1980 | France | |
| 0184997 | 8/1986 | Japan | 370/4 |

OTHER PUBLICATIONS

Communications International, vol. 6, No. 7, Jul. 1979, pp. 48-50.
W. J. Tomlinson et al., "Telecommunications Applications of Integrated Optics and Optoelectronics", Proceedings of the IEEE, vol. 75, No. 11, New York, pp. 1512-1523.
"Monolithically Intregrable High Speed Photodetectors", D. J. Jackson et al., Proc. SPIE 716 (1987) 104.
"Symmetric MOTT Barrier as a Fast Photodetector", Wei et al., Electron Lett 17, 688 (1981).
"Optoelectronic Broadband Switch Array", MacDonald et al., Electron Lett 14 (1978) p. 502.
R. A. Peters, "Optical Switch Matrices for SS-TDMA Applications", Proc. of 7th Internat'l Conf. on Digital Satellite Communications, May 12-16, 1986, pp. 579-585.
L. D. Hutcheson, "Optical Interconnect Technology Developments", 1986 Proc. Fall Joint Computer Conf., Nov. 2-6, 1986, pp. 448-456.
S. F. Sun et al., "A Review on Classification of Optical Switching Systems", IEEE Communications Magazine, vol. 24, No. 3, May 3, 1986, pp. 50-55.
"8×8 Optoelectronic Crossbar Switch", Electronic Letters, Mar. 3, 1988, vol. 24, No. 5, pp. 275-277, G. Tangonan et al.
"Design and Performance of an Optoelectronic Matrix Switch Using Si-p-i-n Photodiodes", 1988 IEEE, Journal of Lightwave Technology, vol. 6, No. 1, Jan. 1988, Aida et al.

Primary Examiner—Reinhard J. Eisenzopf
Assistant Examiner—Kinfe-Michael Negash
Attorney, Agent, or Firm—V. D. Duraiswamy; W. K. Denson-Low

[57] ABSTRACT

A high speed opto-electronic crossbar switch 10 disposed to selectively connect signals carried by first and second input optical beams to an output node 42. The inventive switch 10 includes a selectively actuatable photodetector network 22 for converting the signals carried by the first and second input beams to electrical output signals, and for impressing these output signals upon the output node 42. The photodetector network 22 has a first photodetector 30 in optical alignment with the first input beam, and a second photodetector 32 in optical alignment with the second input beam. The inventive crossbar switch 10 further includes a multiplexer 26 for actuating the first and second photodetectors 30, 32 in response to a control signal. The invention also includes a laser diode circuit 24 for illuminating the first and second photodetectors 30, 32 in response to the control signal.

9 Claims, 1 Drawing Sheet

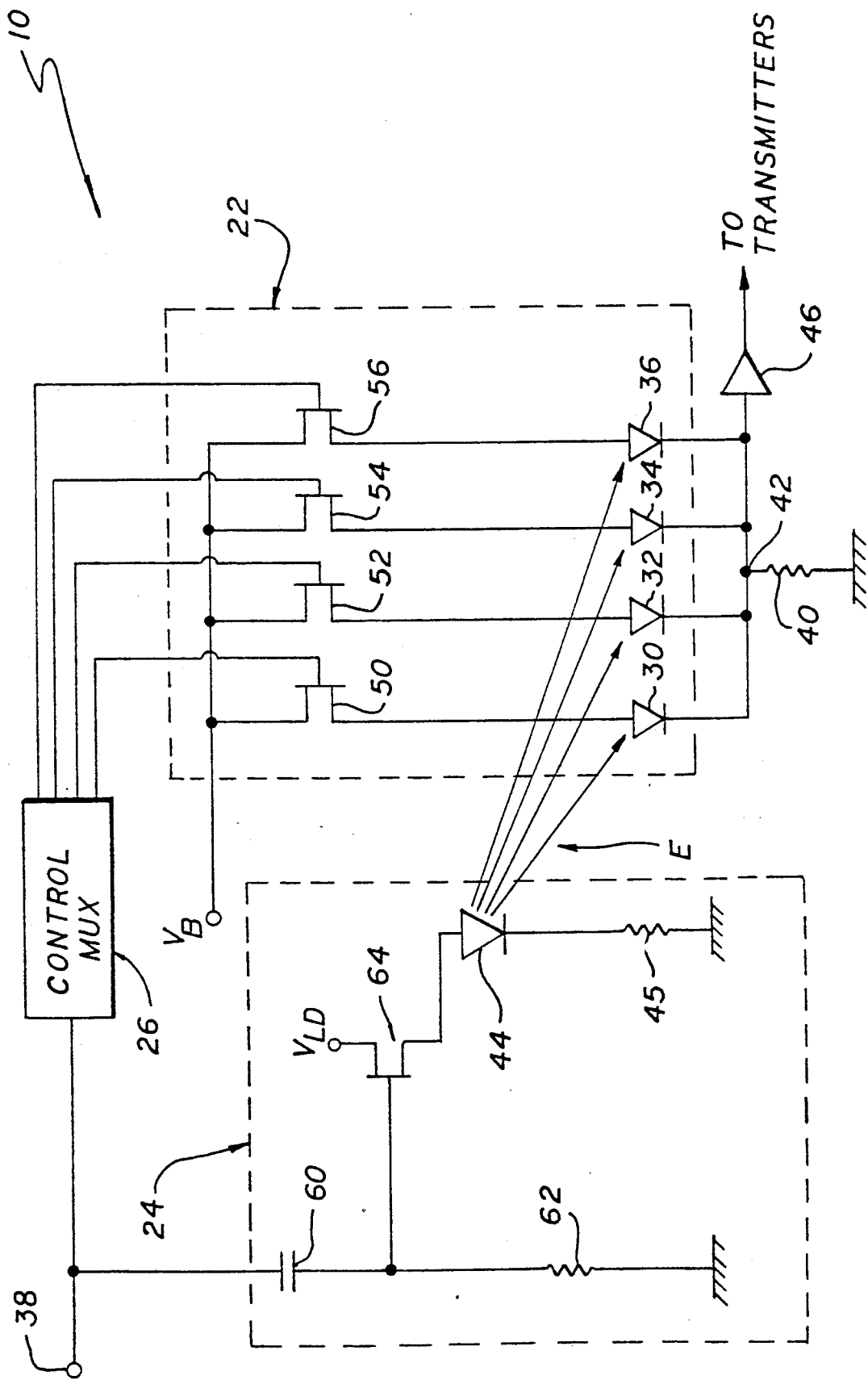

HIGH SPEED OPTO-ELECTRONIC CROSSBAR SWITCH

BACKGROUND OF THE INVENTION

1. Field of the Invention

The present invention relates to signal switching devices. More specifically, the present invention relates to apparatus for switching a plurality of signals in communication networks.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Parallel processors commonly include a large number of processors that execute programs concurrently or in parallel. These architectures typically require a communication network that allows efficient data transfer between processors, and between an individual processor and its associated memories. In many parallel processing systems it is desirable to permit many processors to transfer information simultaneously. Employing optics in parallel processing is particularly effective given the relatively large bandwidth attainable, and the typically low interaction among individual optical beams in linear media. One optical system used in this context is known as a crossbar network. A crossbar network permits a plurality of processors or memories to be dynamically interconnected in a selected configuration without mechanically moving existing interconnections.

Certain crossbar networks are realized completely electronically. That is, resort is not made to the optical domain until a selected number of input data channels have been placed in electrical communication with a desired array of output channels. Only then is data present on the electrical output channels used to modulate an optical carrier, which is subsequently transmitted to a selected destination. Unfortunately, this mode of electronic switching is relatively slow and may impede the overall speed of the computing network in which it is utilized.

Alternatively, other crossbar networks are operative entirely in the optical domain. Specifically, a selected number of optical input beams are interconnected via optical elements to a chosen set of optical output channels.

Unfortunately, channel switching effected entirely in the optical domain is slow, as is channel switching entirely in the electronic domain. Moreover, conventional exclusively optical switching networks are marked by poor interchannel isolation. That is, adjacent optical channels are prone to substantial mutual interference which may degrade overall system performance.

Hence, a need in the art exists for a crossbar switch capable of providing a high switch rate while maintaining acceptable interchannel isolation.

SUMMARY OF THE INVENTION

The need in the art identified above is addressed by the high speed opto-electronic crossbar switch of the present invention. The inventive crossbar switch is disposed to selectively connect signals carried by first and second input optical beams to an output node. The switch of the present invention includes a selectively actuatable photodetector network for converting the signals carried by the first and second input beams to electrical output signals, and for impressing these output signals upon the output node. The photodetector network has a first photodetector in optical alignment with the first input beam, and a second photodetector in optical alignment with the second input beam. The inventive crossbar switch further includes a multiplexer for actuating the first and second photodetectors in response to a control signal. The present invention also includes a laser diode circuit for illuminating the first and second photodetectors in response to the control signal.

DESCRIPTION OF THE DRAWING

The FIGURE is a block diagram representing the high speed opto-electronic crossbar switch of the present invention.

DETAILED DESCRIPTION OF THE INVENTION

The FIGURE is a block diagram representing the high speed opto-electronic crossbar switch 10 of the present invention. The opto-electronic switch 10 includes a photodetector network 22, a laser diode circuit 24 and a control multiplexer 26. The photodetector network 22 includes, in this particular embodiment, four separate photodetectors 30, 32, 34, 36. A number other than four works just as well, depending on the application. Each photodetector 30-36 is individually coupled to an optical fiber (not shown for clarity), with each fiber carrying an input optical data beam. The data beam illuminates the photodetector 30-36 coupled thereto. A control signal impressed upon an input node 38 directs the control multiplexer 26 to actuate one or more of the photodetectors 30-36, which then each generate photocurrent in response to the optical data beam impinging thereon. Flow of this photocurrent through a resistor 40 induces an output signal voltage to be impressed upon an output node 42. An amplifier 46 coupled to the output node 42 amplifies the output signal voltage for transmission. In this manner signals carried by four optical data beams may be selectively switched to a single output channel.

As is described more fully below, one change of state of the switch 10 is effected by impressing a control signal upon the input node 38, thereby inducing one or more of the photodetectors 30-36 to be deactivated. Application of this control signal also causes a laser diode 44 within the diode circuit 24 to briefly flash. This flash illuminates the photodetectors 30-36 with optical energy E immediately subsequent to the deactivation of one or more thereof. The one or more photodetectors 30-36 selected for deactivation then generate photocurrent in response to the illuminative pulse emitted by the diode 44. This photocurrent aids in dissipating the residual voltage (due to intrinsic capacitance) across each photodetector 30-36 selected for deactivation. Accelerated dissipation of this residual voltage expedites transition of a selected photodetector 30-36 to the deactivated state, thereby decreasing the deactivation time thereof. The corresponding reduction in the switching time of the crossbar switch 10 due to this decrease in photodetector deactivation time is a feature of the present invention.

As shown in The FIGURE, the photodetector network 22 includes four photodetectors 30, 32, 34, 36. Again, each of the photodetectors 30-36 is conventionally coupled to an optical fiber associated with an optical channel. Alternatively, the input optical fibers may be terminated with optical lenses which transmit the optical beams carried thereby to the appropriate photodetector 30-36. In this latter configuration the optical fibers do not physically contact the photodetectors 30-36. In the preferred embodiment of The FIGURE each photodetector 30-36 is an InGaAs p-i-n diode. The use of p-i-n diodes is preferred as a result of their fast switching capability.

Typically only one of the photodetectors 30-36 is activated at any one time. Activation of the photodetectors is effected by the control multiplexer 26. CMOS devices for the multiplexer 26 are generally preferred due to their large input impedance when in the nonconducting state. In response to a control signal impressed upon the input node 38 the multiplexer 26 is operative to selectively couple a suitable bias source $V_B$ to a photodetector 30-36 by turning on an appropriate MOSFET device 50, 52, 54, 56. When a MOSFET 50-56 is in the "off" (nonconducting) state, the response of the photodetector 30-36 associated therewith is substantially zero irrespective of whether it is being illuminated by the input signal beam carried by the optical fiber coupled thereto. A photodetector 30-36 can be switched to the "on" state by applying an appropriate control signal to the multiplexer 26 via the input node 38. The control signal is decoded by the multiplexer 26 to provide a suitably actuating gate voltage on one of the MOSFET devices 50-56, thereby coupling the bias voltage $V_B$ to the selected photodetector 30-36.

Each photodetector 30-36 has associated parasitic capacitances $C_p(V)$ and $C_s$, where V is the voltage across the photodetector. $C_p(V)$ is defined by the expression $C_p(V) = C_{po} V_{bi}^{\frac{1}{2}}/(V_{bi}-V)^{\frac{1}{2}}$ where $C_{po}$ is the diode capacitance at zero volts, and $V_{bi}$ is the built-in voltage of the detector (typically 0.7 volts). As mentioned above, when a photodetector 30-36 is switched into the "off" state the accompanying MOSFET switch 50-56 is open circuited. The voltage remaining on the photodetector 30-36 (due to $C_p(V)$ and $C_s$) subsequent to opening the switch 50-56 may then only be dissipated by current $I_o$ generated by the photodetector 30-36. The photo-generated current $I_o$ is produced in response to illumination of the photodetector 30-36 by the optical data beam incident thereon. The rate at which the voltage V remaining on the photodetector 30-36 may be reduced, and hence the rate at which the photodetector 30-36 may be deactivated (deactivation being nominally defined as the point at which the photodetector voltage is approximately 10% of that present in the "on" state), is given by the following expression:

$$dV/dt = \frac{I_o - I_s(\exp(qV/nkT) - 1)}{(C_p(V) + C_s)} \quad [1]$$

where $I_s$ = photodetector saturation current, q = electric charge, n = 2 for an InGaAs p-i-n photodetector, k = Boltzmann's constant, and T = temperature in degrees Kelvin. Unfortunately, to achieve fast (approximately 10 ns) switching, the input signal power incident on the photodetectors of conventional crossbar switches is required to be approximately 1 mW. This requirement is too high for many applications, and limits its optical fanout (the number of data channels into which an input optical carrier may be subdivided).

As mentioned briefly above, the switch 10 of the present invention is disposed to obviate the need for high input optical signal power by utilizing the laser diode 44 to supply additional optical power to the photodetectors 30-36. In particular, to initiate deactivation of a photodetector 30-36 a control signal is applied to the input node 38. The control signal is decoded by the control multiplexer 26, which then impresses a gate voltage of a first polarity on the MOSFET 50-56 coupled to the selected photodetector 30-36. The gate voltage applied to the MOSFET 50-56 decouples the selected photodetector 30-36 from the voltage source $V_B$, thereby interrupting external current flow to the selected photodetector 30-36. When moderately low-doped InGaAs p-i-n photodetectors are utilized, a $V_B$ of approximately $-2$ volts may be employed without a sacrifice in detector bandwidth.

As is evident upon inspection of the FIGURE, application of the control signal to the input node 38 also induces a voltage to develop across a capacitor 60. The accompanying current flow through a resistor 62 causes a voltage of a second polarity, opposite to that of the first polarity, to impinge on the gate of a MOSFET 64. The multiplexer 26 may be designed to deliver a gate voltage of the first polarity to the selected MOSFET 50-56 when a control signal is applied at node 38 that causes development of a gate voltage of the second polarity at MOSFET 64. The values of the capacitor 60 and resistor 62 may be chosen such that the voltage at the gate of the MOSFET 64 reaches the "turn-on" voltage thereof substantially contemporaneously with decoupling of the selected photodetector 30-36 from the source $V_B$. In this way the laser diode 44 is connected to a voltage source $V_{LD}$ at approximately the time at which the externally supplied current to the selected photodetector 30-36 is interrupted. Connection of the laser diode 44 to the source $V_{LD}$ induces current flow through the laser diode 44 and resistor 45, and causes the laser diode 44 to illuminate the selected photodetector 30-36 for as long as the turn-on voltage at the gate of the MOSFET 64 is maintained.

Optical energy from the laser diode 44 which irradiates the selected photodetector 30-36 induces a photogenerated current to flow therein. Again, this photogenerated current expedites the subsidence of residual voltage present on the selected photodetector 30-36 due to the intrinsic capacitance $C_p(V)$ and $C_s$ thereof. The rate at which the selected photodetector may be deactivated (dV/dt), which is proportional to the switching speed of the inventive crossbar switch 10, may now be described as:

$$dV/dt = \frac{I_o + I_{sw} - I_s(\exp(qV/nkT) - 1)}{(C_p(V) + C_s)dV/dt} \quad [2]$$

where $I_{sw}$ is the photocurrent generated by the selected photodetector 30-36 due to illumination by the laser diode 44.

As is evident upon comparison of equations [1] and [2], the photodetector deactivation (turn-off) rate is increased by the presence of the term $I_{sw}$. Examining equation (2), it is apparent that $I_o$ may be significantly decreased without impairing dV/dt if $I_{sw}$ is made sufficiently large. $I_{sw}$ may be made sufficiently large by utilizing a relatively high power laser diode (typically operative at 0.8 μm.), such as that manufactured by Sharp, Inc., located in Tokyo, or other readily commercially available components. As a consequence, the optical fanout of the fiber array feeding the inventive crossbar switch 10 is increased without a corresponding decrease in switching speed. This result follows since the optical power carried by each input fiber may be reduced due to the decreased quantity of photocurrent $I_o$ required by each photodetector 30-36. In certain applications $I_o$ may be made approximately as small as $I_s$. It is therefore a feature of the present invention that the switching time of the crossbar switch 10 is reduced as a result of illumination of the photodetectors 30-36 by the laser diode 44.

The relative values of the capacitor 60 and resistor 62 may be adjusted such that the requisite voltage to activate the MOSFET 64 subsists at the gate thereof for the desired illumination interval. Also, different circuits are possible within the scope of the present invention. For example, in the embodiment of the FIGURE the selected photodetector 30-36 may need to be illuminated by the laser diode 44 over an interval of approximately 1 ns to effect a 10 ns switching rate. This switching speed appears to be between two and three orders of magnitude faster than that exhibited by conventional crossbar switching schemes.

Thus the present invention has been described with reference to a particular embodiment in connection with a particular application. Those having ordinary skill in the art and access to the teachings of the present invention will recognize additional modifications and applications within the scope thereof. For example, metal-semiconductor-metal photodetectors may be substituted for the p-i-n photodetectors used in the preferred embodiment without departing from the scope of the present invention. Similarly, electronic switches other than MOSFET's may be utilized to selectively couple the photodetectors to a bias source.

In addition, the present invention is not limited to the RC laser diode timing circuit disclosed herein. Those of ordinary skill in the art may be aware of other networks for maintaining the requisite turn-on voltage at the gate of the MOSFET 64.

It is therefore contemplated by the appended claims to cover any and all such modifications.

Accordingly,

What is claimed is:

1. A high speed opto-electronic crossbar switch for selectively switching first and second input optical data beam signals to an output node, said crossbar switch comprising:
   selectively actuatable photodetector means having a first photodetector in optical alignment with said first input optical data beam and a second photodetector in optical alignment with said second input optical data beam, for converting said signals to output signal voltages, said photodetectors generating photocurrent in response to the optical data beam signals impinging thereon when selectively actuated, said photodetector means including means for impressing an output signal voltage upon said output node in response to said photocurrent;
   multiplexer means for deactivating at least one of said first and second photodetectors in response to a control signal, said first photodetector being serially connected between said output node and a first transistor switch and said second photodetector being serially connected between said output node and a second transistor switch, said first and second transistor switches each having a control terminal electrically coupled to said multiplexer means, said first and second transistor switches being coupled to a bias supply; and
   laser diode means for illuminating the photodetector deactivated by said multiplexer means in response to said control signal to decrease deactivation time, said laser diode means and said multiplexer means being electrically coupled to an input node of said crossbar switch and said laser diode means including a laser diode, a timing element coupled to said input node, and a transistor switch serially connected between said laser diode and said timing element.

2. The switch of claim 1 wherein said means for impressing said output signals upon said output node includes a resistive network coupled to said output node for converting said signal currents from said first and second photodetectors into signal voltages impressed upon said output node.

3. The switch of claim 2 further including a voltage amplifier coupled to said output node.

4. A high speed opto-electronic crossbar switch for selectively switching first and second input optical data beam signals to an output node, said crossbar switch comprising:
   selectively actuatable photodetector means having a first photodetector in optical alignment with said first input optical data beam and a second photodetector in optical alignment with said second input optical data beam, for converting said signals to electrical output signals, said photodetector means including means for impressing said output signals upon said output node;
   multiplexer means for deactivating said first and second photodetectors in response to a control signal; and
   laser diode means for illuminating the photodetectors deactivated by said multiplexer means in response to said control signal, said laser diode means and said multiplexer means being electrically coupled to an input node of said crossbar switch and said laser diode means including a laser diode, a timing element coupled to said input node, and a transistor switch serially connected between said laser diode and said timing element.

5. An opto-electronic crossbar switch comprising:
   an array of photodetector elements for each receiving an input optical data beam;
   a control circuit for selectively activating and deactivating said photodetector elements; and
   means for decreasing the deactivation time of said photodetector elements, said means including:
   illuminating means for providing optical energy to said photodetector elements, and
   means for turning on said illumination means on or after the deactivation of one or more of said photodetector elements so that said illumination means provides optical energy to the photodetectors selectively deactivated by said control circuit to decrease the deactivation time of the deactivated photodetectors.

6. The invention of claim 5 wherein said illumination means includes a laser diode for emitting the optical energy and means for turning on said laser diode includes an electronic switch.

7. The invention of claim 6 wherein said means for turning on said laser diode includes a resistive - capacitive network to which said electronic switch is electrically connected.

8. The invention of claim 7 wherein said resistive-capacitive network includes a capacitor and a resistor, said resistor being connected to said electronic switch.

9. A method of increasing the switching speed of an opto-electronic crossbar switch having an array of photodetector elements, and a control circuit for selectively activating and deactivating said photodetector elements, said method including the steps of:
   applying an input optical data beam to each of said array of photodetector elements;
   actuating at least one of said photodetectors so that photocurrent is generated in response to the input optical data beam incident thereon;
   deactivating at least one of said photodetectors using a control signal; and
   illuminating with optical energy, said photodetector elements which have been deactivated immediately subsequent to the deactivation.

* * * * *